(12) United States Patent
Matsuo

(10) Patent No.: US 8,299,624 B2
(45) Date of Patent: Oct. 30, 2012

(54) SEMICONDUCTOR DEVICE, CIRCUIT SUBSTRATE, AND ELECTRONIC DEVICE

(75) Inventor: Yoshihide Matsuo, Chino (JP)

(73) Assignee: Seiko Epson Corporation (JP)

( * ) Notice: Subject to any disclaimer, the term of this patent is extended or adjusted under 35 U.S.C. 154(b) by 118 days.

(21) Appl. No.: 12/877,317

(22) Filed: Sep. 8, 2010

(65) Prior Publication Data

US 2011/0089571 A1 Apr. 21, 2011

(30) Foreign Application Priority Data

Oct. 15, 2009 (JP) ................. 2009-238600

(51) Int. Cl.
*H01L 23/48* (2006.01)
*H01L 23/52* (2006.01)
*H01L 29/40* (2006.01)

(52) U.S. Cl. ....................... 257/774; 257/773

(58) Field of Classification Search ................. 257/622, 257/773, 774, 775
See application file for complete search history.

(56) References Cited

U.S. PATENT DOCUMENTS

| | | | |
|---|---|---|---|
| 6,051,503 A | 4/2000 | Bhardwaj et al. | |
| 6,187,685 B1 | 2/2001 | Hopkins et al. | |
| 6,720,661 B2 | 4/2004 | Hanaoka et al. | |
| 6,962,865 B2 | 11/2005 | Hanaoka et al. | |
| 7,102,219 B2 | 9/2006 | Hanaoka et al. | |
| 7,339,273 B2 | 3/2008 | Kameyama et al. | |
| 7,670,955 B2 | 3/2010 | Kameyama et al. | |
| 8,030,780 B2 * | 10/2011 | Kirby et al. | 257/774 |
| 8,084,866 B2 * | 12/2011 | Hiatt et al. | 257/774 |
| 2007/0281474 A1 | 12/2007 | Suzuki et al. | |
| 2008/0284041 A1 * | 11/2008 | Jang et al. | 257/774 |

FOREIGN PATENT DOCUMENTS

| | | |
|---|---|---|
| JP | 2004-200547 | 7/2004 |
| JP | 2006-128172 | 5/2006 |
| JP | 3879816 | 11/2006 |
| JP | 3970211 | 6/2007 |
| JP | 2007-311584 | 11/2007 |

* cited by examiner

*Primary Examiner* — S. V Clark
(74) *Attorney, Agent, or Firm* — Harness, Dickey & Pierce, P.L.C.

(57) ABSTRACT

A semiconductor device has a through electrode formed in a through hole which penetrates a Si substrate from one surface to the other surface of the Si substrate, wherein a rectangular electrode pad is provided on the other surface with an insulation film laid between the electrode pad and the other surface, an opening of the through hole on the one surface side is circular, an opening of the through hole on the other surface side is rectangular, and the area of the opening on the other surface side is made smaller than the area of the opening on the one surface side.

7 Claims, 11 Drawing Sheets

SEMICONDUCTOR DEVICE, CIRCUIT SUBSTRATE, AND ELECTRONIC DEVICE

BACKGROUND

1. Technical Field

The present invention relates to semiconductor devices and, in particular, to a semiconductor device having a through electrode formed therein, a circuit substrate incorporating the semiconductor device, and an electronic device incorporating the semiconductor device.

2. Related Art

Electronic information devices, as typified by cellular telephones, have become more compact and lighter, and the function thereof has become more sophisticated and faster. As a result, the IC which is the heart of such a device is also required to achieve miniaturization and weight reduction and to have more sophisticated function, and it is necessary to increase the added value thereof including shorter TAT (turn around time) and cost reduction.

Generally, it requires time and cost to commercialize what is called a system LSI. In addition, a region where a device element such as a SAW (surface acoustic wave) element and an IC are mounted together has also become smaller and lighter, making it difficult to meet systematization.

The existing system packaging technique has used the wire bonding technique to lay chips one on top of another three-dimensionally, thereby reducing the footprint, making the package lighter and more compact, and achieving sophisticated function. However, it has been believed that the dependence on the wire bonding technique makes it difficult to achieve further miniaturization, weight reduction, and more sophisticated function.

Under these circumstances, in recent years, a through hole has been formed in a silicon substrate forming an IC by a technique called TSV (through Si via), and a through electrode has been formed by using the through hole. By doing so, the wiring distance in obtaining electrical continuity between the multilayer chips is minimized, whereby the system package is made lighter and more compact.

As for TSV, various techniques have been disclosed as described in Japanese Patent No. 3,879,816, Japanese Patent No. 3,970,211, JP-A-2007-311584 and JP-A-2006-128172 (Patent Documents 1 to 4). For example, in the technique disclosed in Patent Document 1, a depression is formed on the surface of a Si substrate by dry etching, a through hole is formed by a laser beam, and an intermediate part of the through hole is widened by wet etching.

Moreover, Patent Document 2 describes that, when a through hole is formed from the front surface of a Si substrate by a laser beam or dry etching, the side wall of the through hole is formed in a tapered shape so that an opening area is decreased from an opening on one surface to an opening on the other surface in order to make it easy to form an insulation film.

In addition, Patent Document 3 describes that the side wall of a through hole is formed perpendicularly by forming the through hole in a Si substrate by using the Bosch process.

Furthermore, Patent Document 4 describes that poor connection due to deformation of an electrode pad associated with distortion caused by the formation of a through hole is prevented by making the width of the bottom of the through hole greater than that of an intermediate part of the through hole by performing overetching when the through hole is formed in a Si substrate by dry etching.

Of the patent documents described above, the technique disclosed in Patent Document 1 may make it difficult to form an insulation film on the inside surface of a through hole, and an enlarged intermediate part of the through hole makes the technique unfit to obtain a layout configuration with a narrow pitch by miniaturization. On the other hand, the technique disclosed in Patent Document 2 makes it easy to form an insulation film on the inside surface of a through hole. However, a large opening makes this technique also unfit to obtain a layout configuration with a narrow pitch by miniaturization.

Moreover, in the technique disclosed in Patent Document 3, overetching at the time of formation of a through hole is considered to become necessary for commercial mass production due to, for example, variations in the etching rate. In this case, as disclosed in Patent Document 4, a notch directed outward is formed between the bottom of the through hole and the insulation film. The notch in an insulation film interface part becomes a shadow for the opening, making it difficult to form the insulation film on the inside wall surface of the through hole. Moreover, since the amount of overetching varies depending on variations in the thickness of a Si substrate or variations in the etching rate, it is difficult to control the notch shape. Incidentally, U.S. Pat. No. 6,187,685 B1 (Patent Document 5) proposes a method for releasing electric charges at an insulation film interface part, the electric charges which cause a notch at the time of dry etching. However, this method does not promise the effect thereof in a laminated substrate such as a laminated chip because, in such a laminated substrate, a surface to which a pulse is applied is not a subject to be etched.

SUMMARY

An advantage of some aspects of the invention is to provide a semiconductor device that can increase the reliability of connection without increasing the area of apart where connection with an electrode pad is established and reliably form an insulation film on the inside wall surface of a through hole by finding an ingenious shape of an opening of a through electrode.

Another advantage of some aspect of the invention is to solve at least part of the problems described above, and the invention can be realized as an embodiment or an application example described below.

Application Example 1

A semiconductor device according to this application example is a semiconductor device having a through electrode formed in a through hole which penetrates a Si substrate from one surface to the other surface of the Si substrate, wherein a rectangular electrode pad is provided on the other surface with an insulation film laid between the electrode pad and the other surface, an opening of the through hole on the one surface side is circular, an opening of the through hole on the other surface side is rectangular, and the area of the opening on the other surface side is made smaller than the area of the opening on the one surface side.

According to the semiconductor device with such a feature, both the electrode pad and the opening (the opening on the other surface side) located on the through hole side are rectangular. This makes it possible to make the area of the part joined to the electrode pad as large as possible and increase the reliability of connection of the through electrode without increasing the area of the joint part, that is, the area of the opening on the other surface side. Moreover, by making the opening on the other surface side narrower than the opening on the one surface side, a part which becomes a shadow from the opening on the one surface side to the opening on the other surface side is eliminated when an insulation film is formed on the inside wall surface of the through hole by CVD or the like. This makes it possible to form the insulation film reliably.

Application Example 2

In the semiconductor device according to Application Example 1, the through electrode may penetrate the insulation film and may be connected to the electrode pad.

Application Example 3

In the semiconductor device according to Application Example 1 or Application Example 2, the area of the opening on the other surface side may be smaller than the area of the electrode pad.

By making the area of the opening on the other surface side smaller than the area of the electrode pad, there is no possibility that the through electrode is moved off the electrode pad even when the position of the opening on the other surface side is shifted.

Application Example 4

In the semiconductor device according to any one of Application Examples 1 to 3, the through hole may have a truncated pyramid-shaped inclined surface in the opening on the other surface side, the inclined surface directed toward the center of the opening.

By providing such an inclined surface, it is possible to form an insulation film reliably even near the bottom of the through hole.

Application Example 5

In the semiconductor device according to Application Example 4, the one surface of the Si substrate may be a (100) face, and the inclined surface may be a (111) face.

With this feature, it is possible to make the opening on the other surface have a rectangular shape no matter what shape the opening on the one surface is.

Application Example 6

In the semiconductor device according to Application Example 5, a crystal face of the Si substrate may be determined such that the edges of the Si substrate and the sides of a rectangular opening formed on the other surface are parallel to each other.

With this configuration, it is possible to make the opening on the other surface have a rectangular shape no matter what shape the opening on the one surface is and match parallel the sides of the electrode pad and the sides of the opening.

Application Example 7

A circuit substrate according to this application example is a circuit substrate on which the semiconductor device according to any one of Application Examples 1 to 6 is mounted.

Application Example 8

An electronic device according to this application example is an electronic device on which the semiconductor device according to any one of Application Examples 1 to 6 is mounted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of a semiconductor device, a circuit substrate, and an electronic device of the invention will be described in detail with reference to the drawings.

Figure 1:
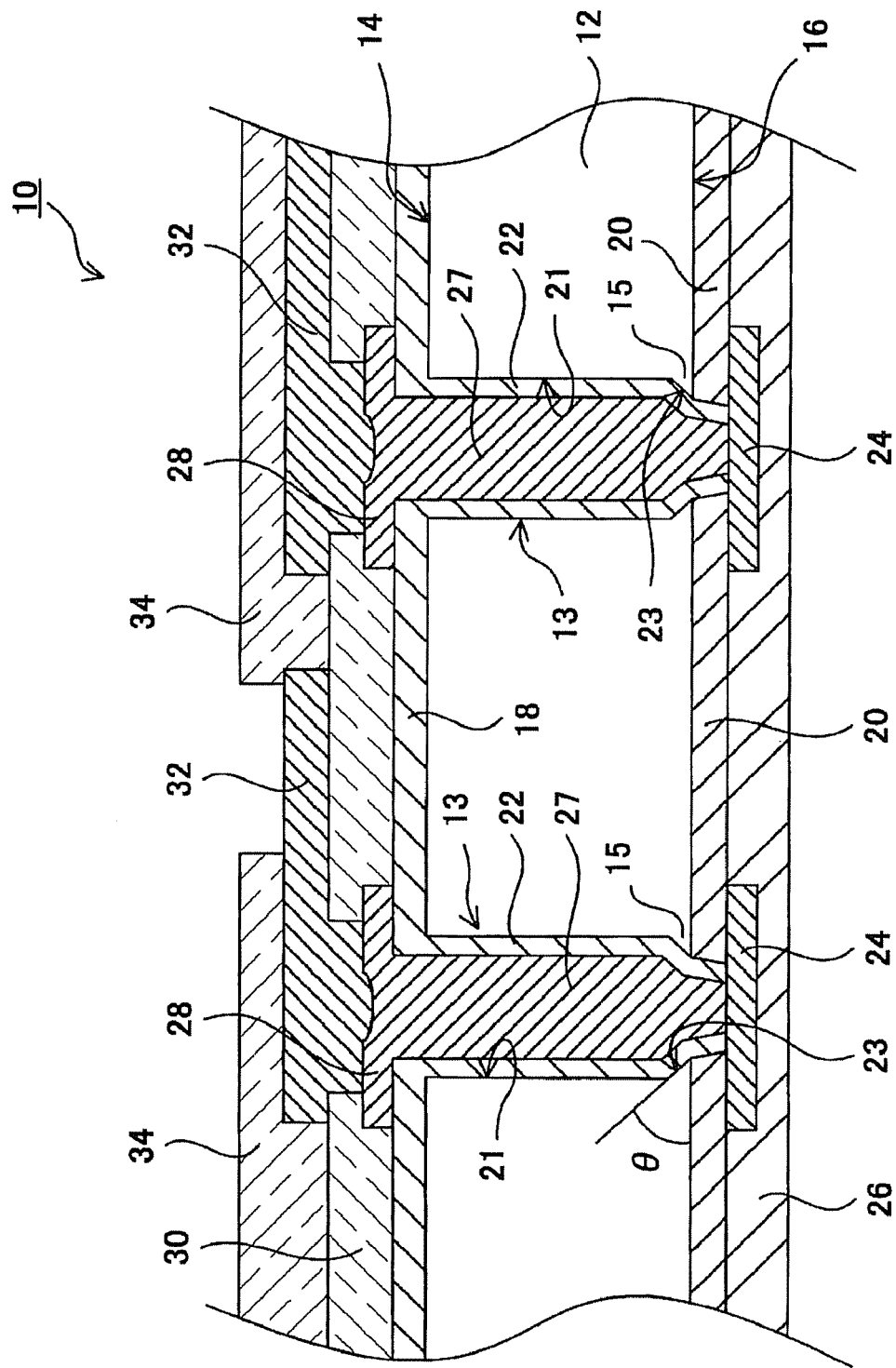
FIG. 1 is a partially enlarged view showing a characteristic structure of a semiconductor device according to an embodiment.

First, referring to FIG. 1, a first embodiment of the semiconductor device of the invention will be described. Incidentally, FIG. 1 is a partially enlarged sectional view showing principal portions of the semiconductor device according to the first embodiment.

A semiconductor device 10 according to this embodiment includes, as basic portions thereof, a Si substrate 12, a through electrode (hereinafter referred to as a TSV) 13 provided in the Si substrate 12, and a rearrangement wiring layer 26 formed on an active face of an integrated circuit (not shown).

The Si substrate 12 is a substrate having a (100) face as a principal surface, and has one surface 14 and the other surface 16. On the one surface 14 and the other surface 16, insulation films 18 and 20 are respectively formed. The type of the insulation films 18 and 20 is, for example, silicon oxide ($SiO_2$); in some cases, the insulation films 18 and 20 may be formed of other insulating materials.

On the other surface 16, an electrode pad 24 is formed with an insulation film 20 laid between the other surface 16 and the electrode pad 24. The material of the electrode pad 24 only has to be metal used in a wiring pattern forming the rearrangement wiring layer 26, and examples thereof include aluminum (Al), an aluminum alloy (an Al alloy), and copper (Cu).

The TSV 13 is formed from the one surface 14 to the back of the electrode pad 24. The TSV 13 includes a through hole 21, an insulation film 22, and conductive metal 27. The through hole 21 is formed in the Si substrate 12 from an opening of the insulation film 18 formed on the one surface 14 to an opening of the insulation film 20 formed on the other surface 16. The opening of the through hole 21 formed on the other surface 16 side has an inclined surface 23 along a (111) face ($\theta=54.7°$ relative to the opening) which is a crystal face of the Si substrate 12. As a result, the through hole 21 is configured so as to have an inclined portion 15 jutting out inward at an interface between the through hole 21 and the insulation film 20 formed on the other surface 16.

The through hole 21 is formed in a position in which the through hole 21 overlaps the above-described electrode pad 24 in a vertical direction, and the insulation film 22 is formed along the inside wall surface of the through hole 21 from the insulation film 18 formed on the one surface 14 to the insulation film 20 formed on the other surface 16. As is the case with the above-mentioned insulation films 18 and 20 formed on the one surface 14 and the other surface 16, respectively, it is possible to use $SiO_2$ as the material of the insulation film 22. It is preferable that the insulation film 22 on the inside wall surface of the through hole 21 be formed by vapor deposition such as chemical vapor deposition (CVD). Since CVD is performed from the one surface 14 side of the through hole 21, the formation of the inclined surface 23 along the crystal face of the Si substrate 12 at the opening of the other surface 16 side makes it possible to form the insulation film 22 reliably even near the opening on the other surface 16 side of the minute and narrow through hole 21.

The conductive metal 27 is placed inside the insulation film 22 formed on the inside of the through hole 21. At the opening formed on the one surface 14 side, the conductive metal 27 forms an electrode pad 28 with the insulation film 18 laid between the conductive metal 27 and the one surface 14, and serves as a base point of a pattern for forming a mounting electrode. On the other hand, at the opening formed on the other surface 16 side, the conductive metal 27 is connected to the electrode pad 24, and establishes electrical continuity between the electrode pad 28 formed on the one surface and the electrode pad 24 formed on the other surface.

Figure 2:
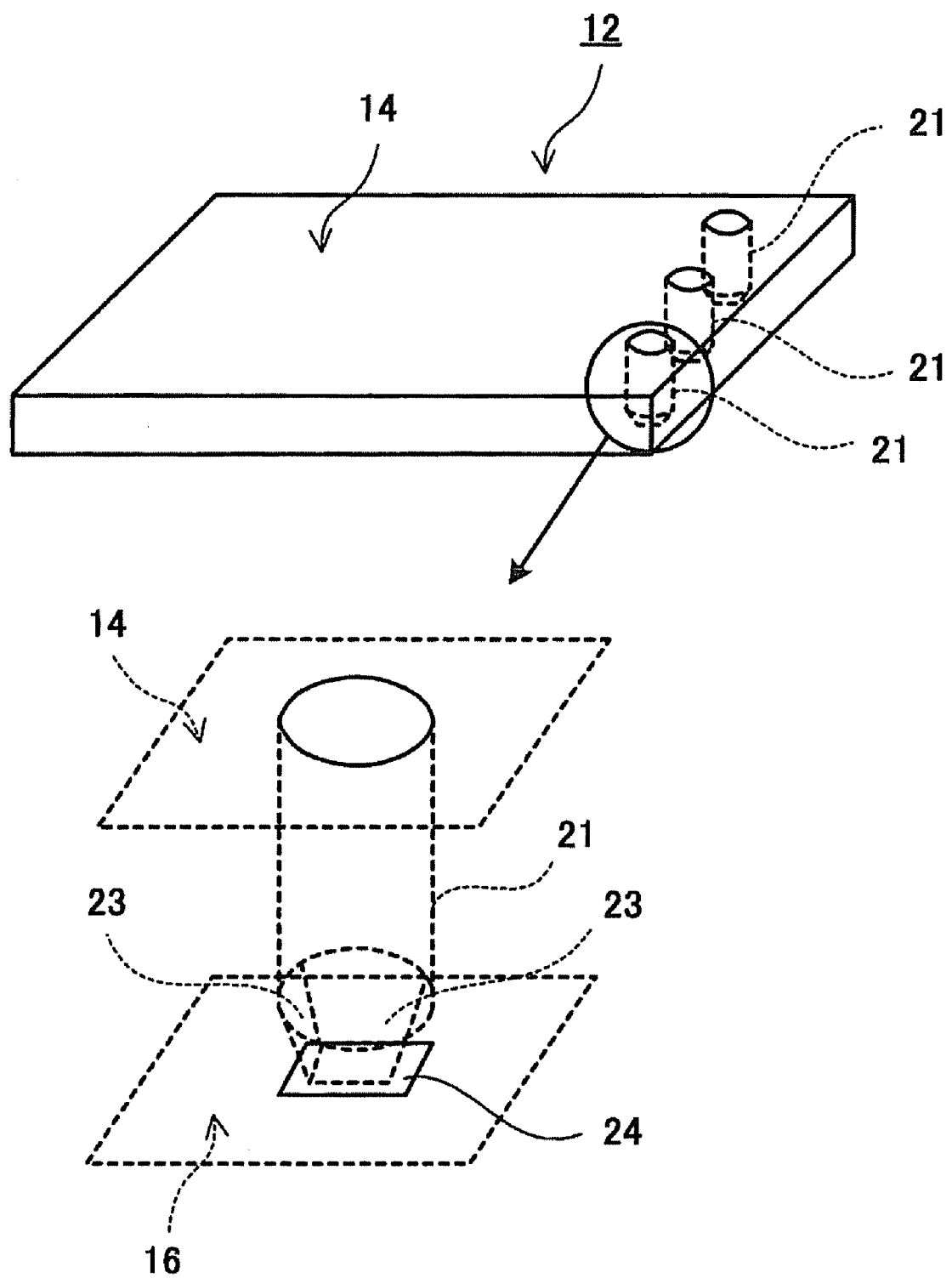
FIG. 2 is a perspective view showing the layout relationship and the characteristics of the shapes of a Si substrate, a through hole, and an electrode pad.

In general, a plurality of electrode pads 24 each having the above-structured TSV 13 are formed. In this case, as shown in FIG. 2, the electrode pads 24 are often placed near the edge of the Si substrate 12 along that edge. The reason is as follows. By forming an integrated circuit (not shown) in a part closer to the center of the Si substrate 12 than the electrode pads 24 formed near the edge of the Si substrate 12, it is possible to prevent a breakdown of the integrated circuit caused by the formation of the TSV 13.

FIG. 2 is a perspective view showing the relationship between the Si substrate 12, the through hole 21, and the electrode pad 24 and morphological characteristics thereof. As shown in FIG. 2, the through hole 21 has a circular opening on the one surface 14 side and a rectangular opening on the other surface 16 side. Moreover, a change in the shape of the through hole 21 from the circular shape to the rectangular shape is due to the formation of the inclined surface near the opening on the other surface 16 side along the crystal face of the Si substrate 12. The opening on the other surface 16 side and the electrode pad 24 are formed so that the opening is made smaller than the electrode pad 24 and the opening is placed inside the electrode pad 24.

As described above, by making the opening of the through hole 21 on the one surface 14 side have a circular shape, a difference in line width due to a difference in wiring direction at the time of formation of the wiring pattern on the one surface 14 is not caused. This makes it possible to increase pattern formation flexibility. In addition, by forming the opening on the other surface 16 as a rectangle whose area is smaller than the area of the electrode pad 24, it is possible to make the area of the opening as large as possible efficiently relative to the electrode pad 24. This makes it possible to increase the reliability of connection between the TSV 13 and the electrode pad 24 without increasing the area of the opening on the other surface 16.

Here, it is preferable that the crystal direction of the substrate be determined such that the edges of the Si substrate 12 and the sides of the rectangular opening formed on the other surface 16 at the time of formation of the through hole 21 are parallel to each other. With the Si substrate 12 whose crystal direction is determined in the manner as described above, it is possible to make the opening on the other surface 16 side have a rectangular shape no matter what shape the opening on the one surface 14 is and match the sides of the electrode pad 24 and the sides of the opening. This eliminates the need to perform careful positioning and angle adjustment between the electrode pad 24 and the through hole 21 efficiently in a small area, and makes it possible to form an opening which makes effective use of the inside of the electrode pad 24 by performing a first etching process and a second etching process, which will be described later in detail.

Around the metal pad 28 formed on the one surface 14 side, a first resin layer 30 is formed, and, after a wiring pattern 32 for performing rearrangement wiring according to the specifications of the semiconductor device 10 is formed, a second resin layer 34 is formed all over the surface except for a mounting external pad in order to protect the wiring pattern 32. Here, both the first resin layer 30 and the second resin layer 34 act as a passivation film. Examples of the material of the first resin layer 30 include polyimide resin, and examples of the material of the second resin layer 34 include a solder mask.

Next, a method for producing the semiconductor device having the characteristic structure described above will be described with reference to FIGS. 3 to 14.

Figure 3:
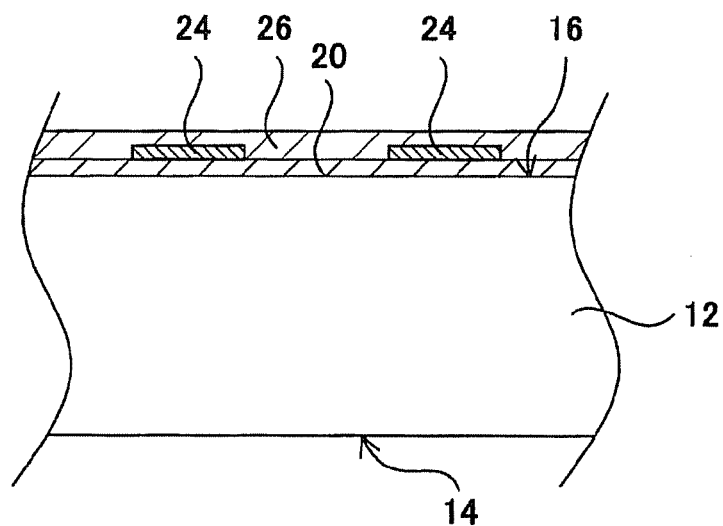
FIG. 3 is a diagram for explaining a method for producing the semiconductor device according to the embodiment, the diagram showing the formation of a rearrangement wiring layer.
Figure 4:
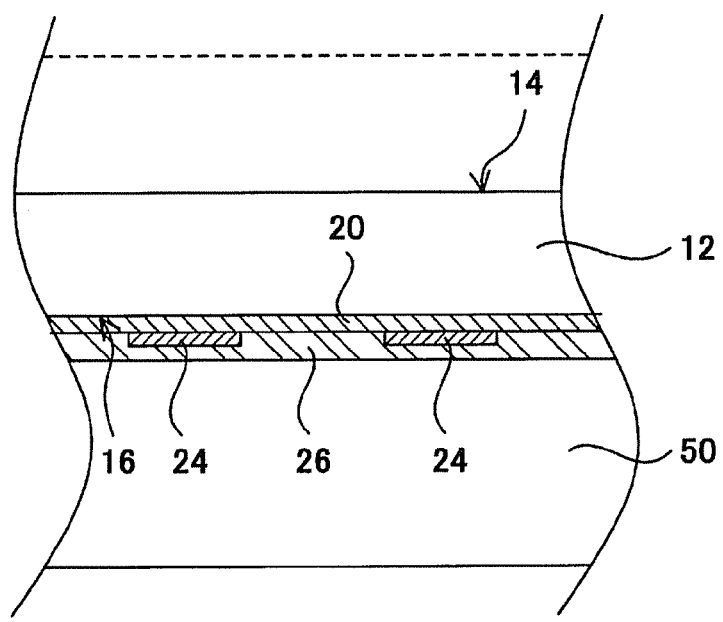
FIG. 4 is a diagram for explaining the method for producing the semiconductor device according to the embodiment, the diagram showing how to join a glass support and make a Si substrate thinner.

First, as shown in FIG. 3, an integrated circuit (not shown) is formed on the other surface of the Si substrate 12. The electrode pad 24 is formed near the edge of the Si substrate 12 in an external region of the integrated circuit with the insulation film 20 laid between the Si substrate 12 and the electrode pad 24, and the rearrangement wiring layer 26 is then formed. The insulation film 20 may be formed by CVD. Next, as shown in FIG. 4, a glass support 50 is joined to the Si substrate 12 with the rearrangement wiring layer 26 formed on the other surface 16 after forming a resin layer (not shown) on a top surface of the rearrangement wiring layer 26. Here, the glass support 50 augments the mechanical strength when the Si substrate 12 is worked on, and the resin layer joins the Si substrate 12 and the glass support 50 and acts as a stress relaxation layer eliminating irregularities of the rearrangement wiring layer 26 and equalizing stress which is placed when the Si substrate 12 and the glass support 50 are joined together.

After the glass support 50 is joined to the Si substrate 12, the Si substrate 12 is turned upside down and is made thinner by grinding or polishing. By doing so, it is possible to make the Si substrate 12 have a thickness which falls within the permissible thickness range of vertical hole formation performed by using the Bosch process.

Figure 5:
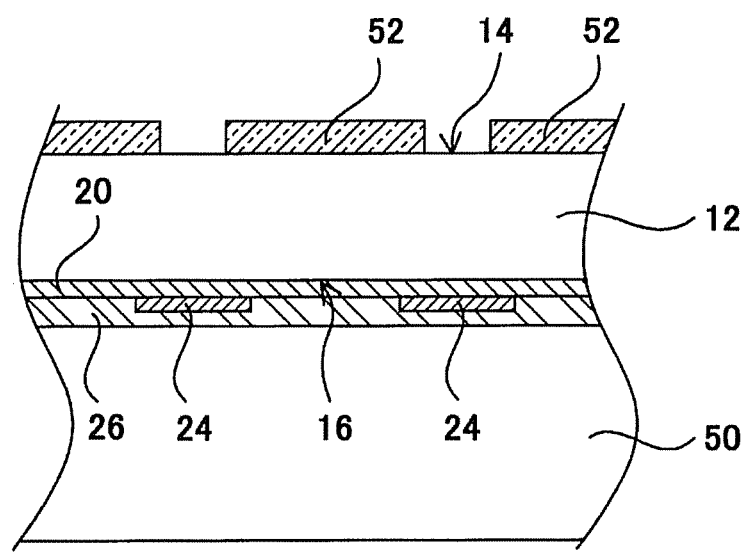
FIG. 5 is a diagram for explaining the method for producing the semiconductor device according to the embodiment, the diagram showing the formation of a resist mask on the Si substrate.

After the Si substrate 12 is made thinner, as shown in FIG. 5, a resist mask 52 is formed on the one surface of the Si substrate 12. The resist mask 52 may be formed by forming a film on the Si substrate 12, the film made of resist material such as a photoresist, an electron resist, or a Z-line resist, by a method such as spin coating, dipping, or spray coating and performing pattern formation on this film. The patterning of the resist mask 52 is performed by exposing a resist film from which the solvent has been removed by pre-baking and developing the resist film by using a mask suitable for an intended pattern. The exposure and development may be performed by irradiation of energy appropriate to the resist material and by performing etching by using an etching liquid appropriate to the resist material.

Figure 6:
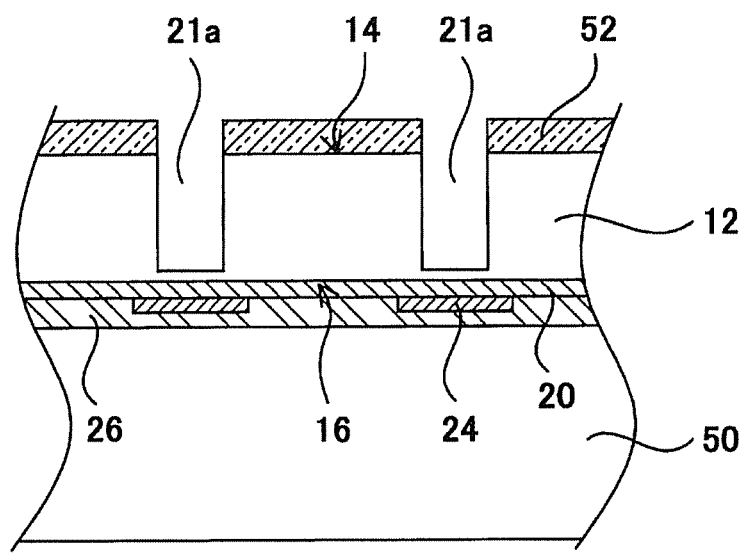
FIG. 6 is a diagram for explaining the method for producing the semiconductor device according to the embodiment, the diagram showing a first etching process performed on the Si substrate.

Next, as shown in FIG. 6, dry etching is performed on the Si substrate 12 exposed through the opening of the resist mask 52 by using a first etching gas, whereby an opening 21a for forming a through hole is formed in the Si substrate 12. At this time, etching is slightly performed on part of the resist mask 52 in parallel with the etching performed on the Si substrate 12, whereby a product of the first etching gas and the resist mask component is formed. Here, the component of the first etching gas is SF-based gas, for example, and specific examples thereof include sulfur hexafluoride ($SF_6$) gas.

The dry etching process may be performed by reactive ion etching (RIE), and, more specifically, it is preferable to use the Bosch process for performing deep RIE. The Bosch process is an etching process in which etching and side-wall protection of the opening formed by the etching are repeated, and makes possible etching with a high aspect ratio.

Figure 15:
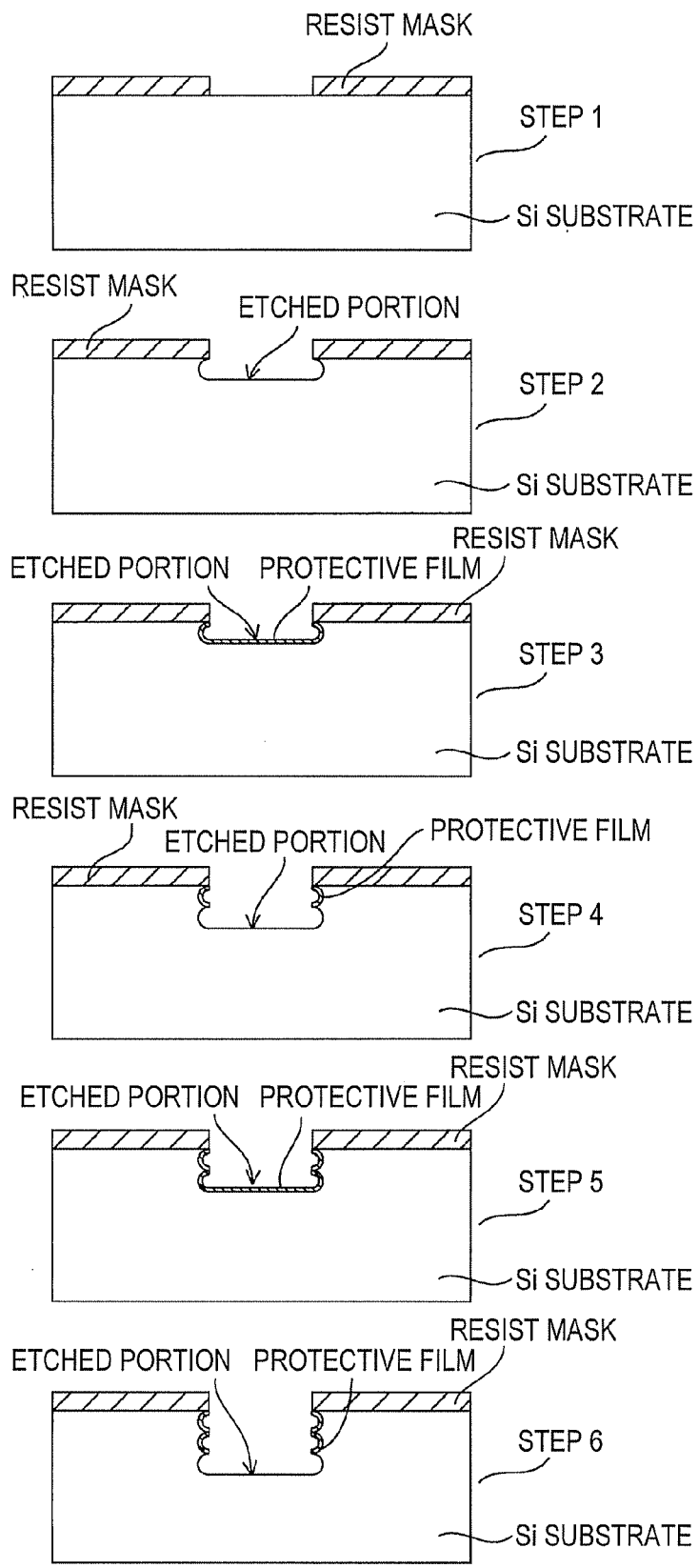
FIG. 15 is a diagram explaining how the Bosch process is performed.

A specific process of the Bosch process will be described with reference to FIG. 15. First, a chamber in which etching of the Si substrate is performed is filled with $SF_6$ gas, and electromagnetic waves or the like are applied to turn the $SF_6$ gas into plasma (step 1). The radical species in the $SF_6$ gas turned into plasma perform isotropic etching on the Si substrate exposed through the opening of the resist mask, and the ion species performs anisotropic etching on the Si substrate, the anisotropic etching which is performed in the thickness direction of the Si substrate, whereby an etched portion is formed (step 2). Next, the chamber is filled with polytetrafluoroethylene (PTFE)-based gas (CF-based gas) such as $C_4F_8$, whereby a protective film is formed on the etched portion (step 3). Then, in dry etching performed by using the $SF_6$ gas, the ion species in the $SF_6$ gas turned into plasma destroy the protective film formed on the bottom of the etched portion by sputtering, whereby an etched portion is formed by isotropic etching and anisotropic etching (step 4). Then, as is the case with the step 3, a protective film is formed by using the $C_4F_8$ gas (step 5), and an etching process performed by using the $SF_6$ gas is repeated, whereby a deep trench with a high aspect ratio is obtained (step 6).

With such a process, based on the number of repeated operations of etching and side-wall protection and the etching rate of one etching operation, it is possible to calculate the etching depth of the Si substrate 12. Incidentally, when etching of the Si substrate 12 is performed by dry etching without performing the Bosch process, it is possible to calculate the etching depth of the Si substrate 12 based on the etching rate of the Si substrate 12, the etching rate dependent on the etching gas.

After a predetermined number of etching operations of the Si substrate 12 performed by using the first etching gas is performed or etching of the Si substrate 12 performed by using the first etching gas is performed for a predetermined time and it is presumed that etching by the first etching gas has performed to an intended depth, the chamber is filled with a second etching gas. Incidentally, the etching depth obtained by the first etching gas may be set to a depth at which the thickness of the opening 21a for forming a through hole from the bottom thereof to the other surface 16 becomes about ½ of the radius of the opening 21a for forming a through hole. Moreover, as the second etching gas according to this embodiment, CF-based gas such as $C_4F_8$ gas may be used. When the Bosch process is adopted in the etching process performed by using the first etching gas, it is considered that the chamber is filled with the second etching gas by increasing the amount of $C_4F_8$ gas with which the chamber is to be filled.

As a result of the chamber being filled with the second etching gas, a crystal face along the (111) face of the Si substrate 12 appears on the bottom of the opening 21a for forming a through hole. The reason is considered to be as follows. Reaction occurs between the product of the first etching gas and the resist mask and the second etching gas, whereby etchant having an alkali group (OH group) is produced, and anisotropic etching along the crystal face of the Si substrate 12 is performed by this etchant.

This is based on the following idea. The (111) face whose etching rate is lower that that of the (100) face of the Si substrate 12 appears on the worked surface when wet etching with no sputtering by ions is performed. On the other hand, the phenomenon which occurs when the chamber is filled with the second etching gas is wet-like etching using an alkali group because the properties of the worked surface obtained after the chamber is filled with the second etching gas bear a striking resemblance to the features of the working performed by wet etching.

Figure 7:
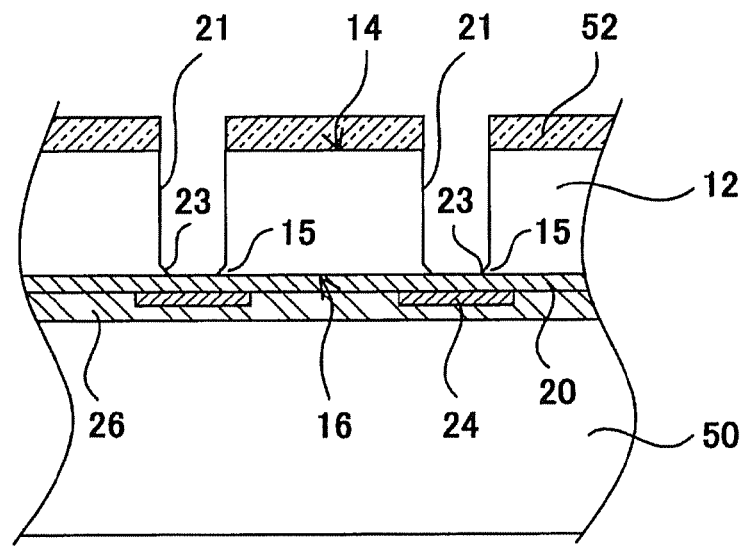
FIG. 7 is a diagram for explaining the method for producing the semiconductor device according to the embodiment, the diagram showing a second etching process performed on the Si substrate.

Since the (111) face has an angle of 54.7° relative to the opening when the (100) face is set as an etching start face, a worked surface having a virtually V-shaped cross-sectional shape appears on the etched surface of the opening 21a for forming a through hole. As a result, when the through hole is formed by continuously performing etching by using the second etching gas, the inclined portion 15 jutting out inward toward the inside of the through hole 21 is formed in the opening on the other surface side as shown in FIG. 7.

As described above, by forming the inclined portion 15 jutting out inward on the inside of the through hole 21, even when overetching is performed after the formation of the through hole 21 with consideration given to variations in the thickness of the Si substrate 12 or variations in the etching rate, it is possible to prevent an external notch from being formed by electrical charges at an interface between the through hole 21 and the insulation film 20.

Figure 8:
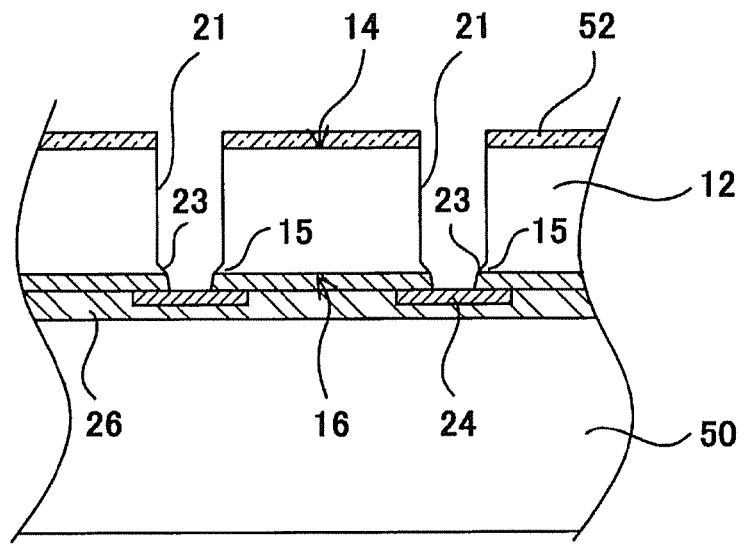
FIG. 8 is a diagram for explaining the method for producing the semiconductor device according to the embodiment, the diagram showing a process for making a through hole and an electrode pad communicate with each other.

After the through hole 21 is formed, etching is performed on the insulation film 20 on the other surface 16 side, the insulation film 20 exposed as the bottom of the through hole 21, and the electrode pad 24 is exposed on the bottom of the through hole 21 (see FIG. 8). As in this embodiment, when the insulation film 20 is formed of $SiO_2$, the etching only has to be performed as dry etching using CF-based gas (for example, $CF_4$ gas).

Figure 9:
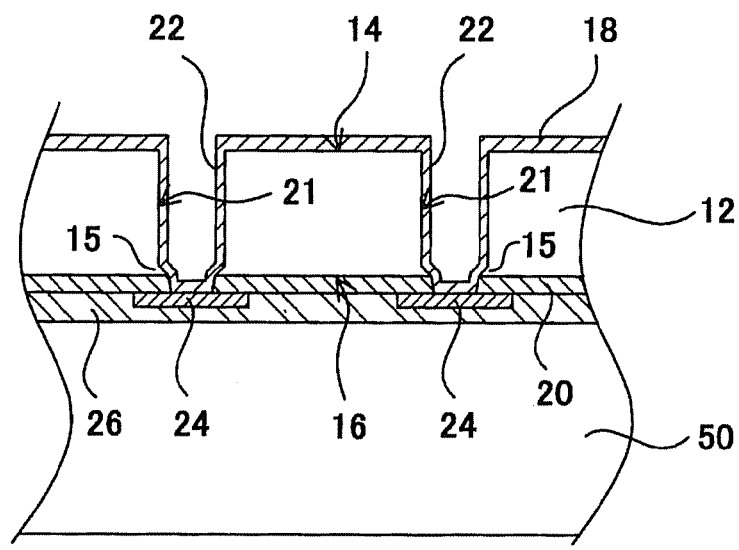
FIG. 9 is a diagram for explaining the method for producing the semiconductor device according to the embodiment, the diagram showing a process for forming an insulation film on the through hole and one surface.

After the through hole is formed in the insulation film 20 by dry etching, the resist mask 52 formed on the one surface is removed, whereby the insulation films 22 and 18 are formed on the inside surface of the through hole 21 and on the one surface 14. The insulation films 22 and 18 may be formed by CVD. As shown in FIG. 9, the insulation films 22 and 18 formed by CVD are formed on the one surface 14 of the Si substrate 12, the side wall of the through hole 21, and the bottom of the through hole 21. Incidentally, the insulation films 22 and 18 formed by CVD only have to be $SiO_2$. As shown in FIG. 9, near the opening on the other surface 16, the insulation film 22 formed on the side surface of the through hole 21 is formed along the inclined surface 23 (see FIGS. 1, 7, and 8) forming the inclined portion 15, whereby film formation is performed reliably on the bottom of the minute and narrow through hole 21.

Figure 10:
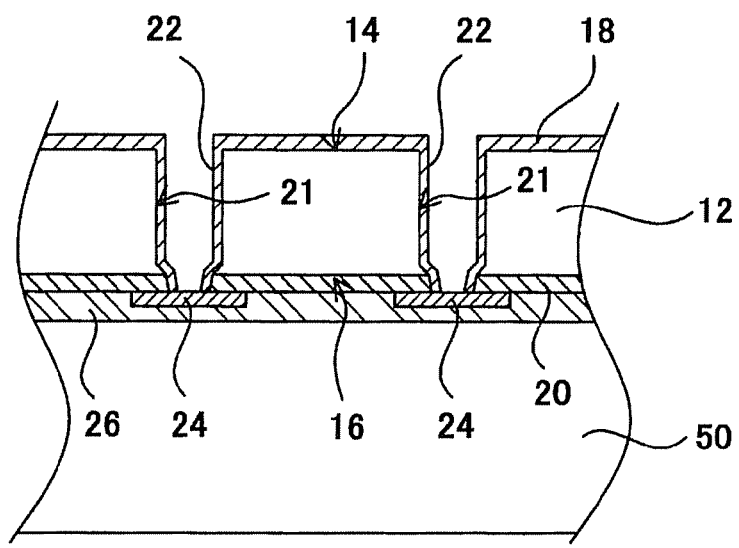
FIG. 10 is a diagram for explaining the method for producing the semiconductor device according to the embodiment, the diagram showing bottom etching performed on the insulation film formed on the inside surface of the through hole.

On the insulation films 22 and 18 formed in the manner as described above, bottom etching by which the insulation film on the bottom of the through hole is etched is performed. As a result, as shown in FIG. 10, it is possible to provide isolation between the Si substrate 12 and the electrode pad 24 while making the electrode pad 24 and the through hole 21 communicate with each other. Incidentally, bottom etching may be dry etching performed by using CF-based gas as was mentioned above.

Figure 11:
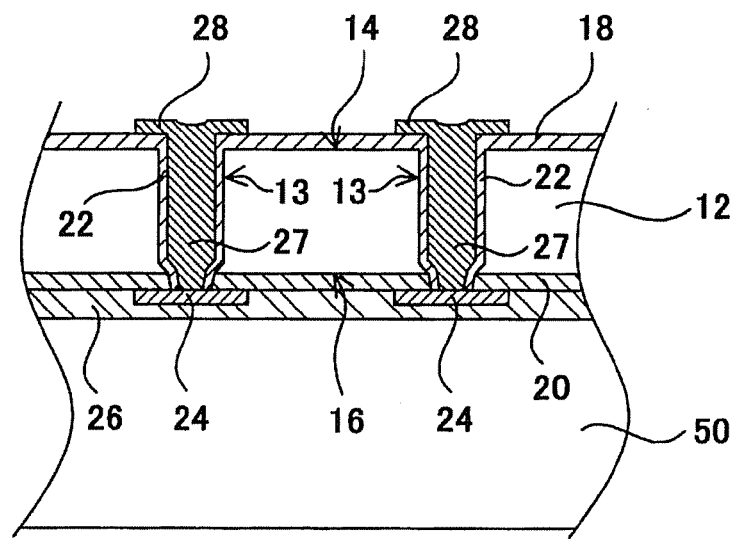
FIG. 11 is a diagram for explaining the method for producing the semiconductor device according to the embodiment, the diagram for explaining the formation of the through electrode and the electrode pad.

Next, as shown in FIG. 11, the inside of the through hole 21 on which the insulation film 22 is formed is plated, whereby the conductive metal 27 is formed. In this way, the TSV 13 is formed. The inside of the through hole 21 may be plated by ion plating which is physical vapor deposition (PVD) or sputtering. The metal film is formed all over the one surface of the Si substrate 12 by using such a technique, and etching is performed so as to leave only a part where the necessary electrode pad 28 is formed, whereby it is possible to form the TSV 13 having the conductive metal 27 and the electrode pad 28.

Figure 12:
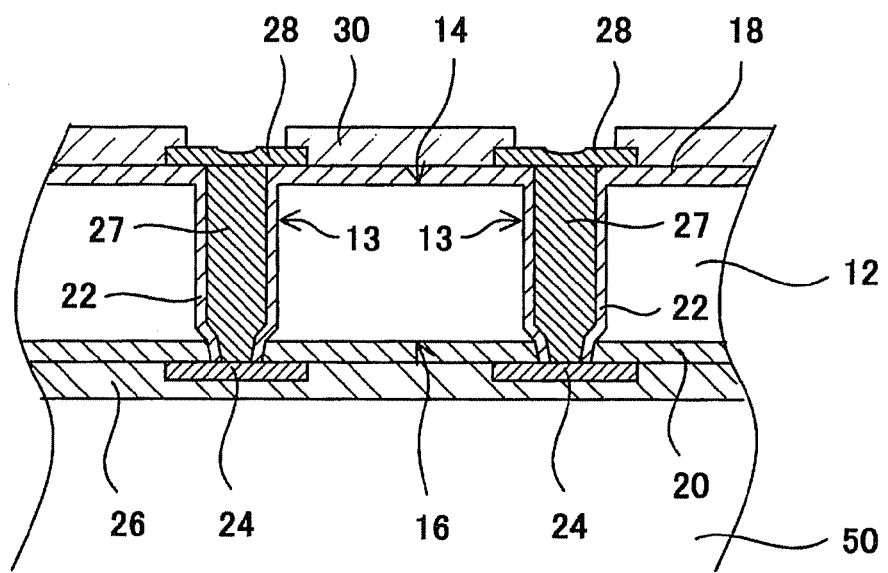
FIG. 12 is a diagram for explaining the method for producing the semiconductor device according to the embodiment, the diagram showing the formation of a first resin layer.
Figure 13:
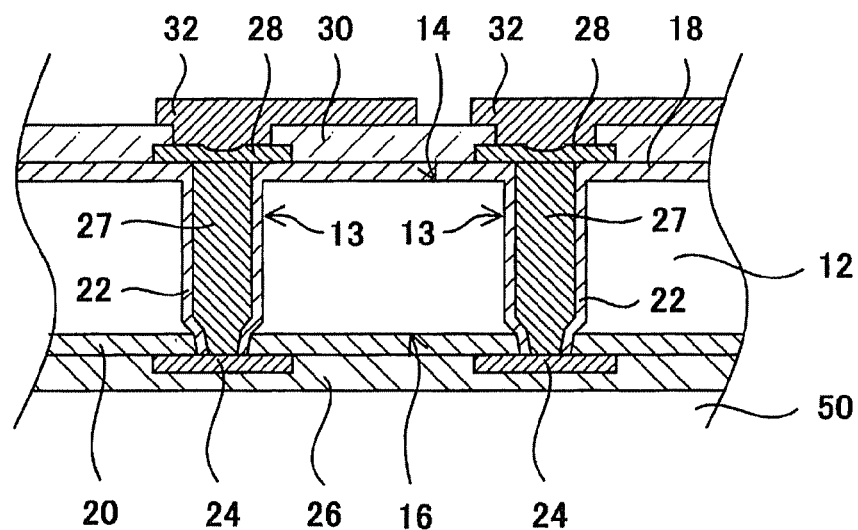
FIG. 13 is a diagram for explaining the method for producing the semiconductor device according to the embodiment, the diagram showing how a wiring pattern is formed.
Figure 14:
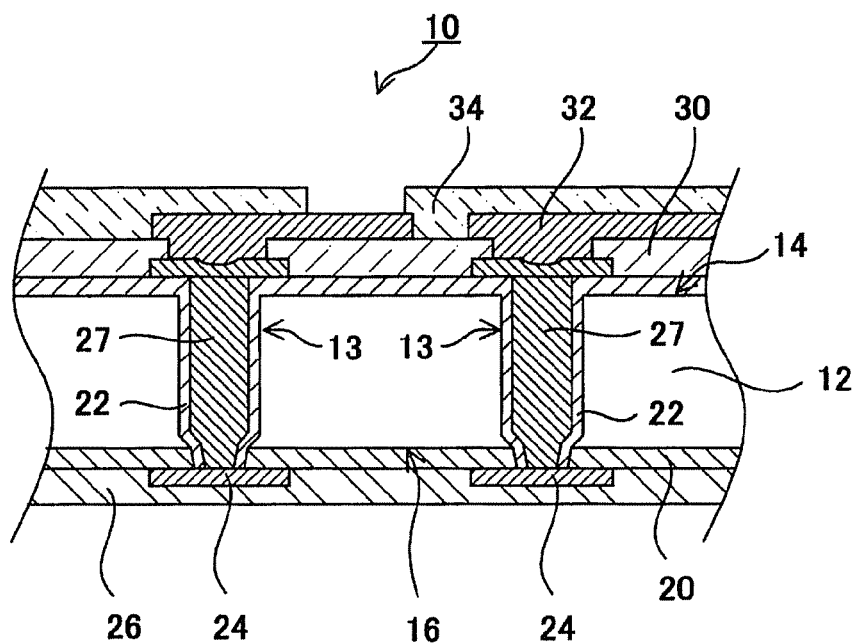
FIG. 14 is a diagram for explaining the method for producing the semiconductor device according to the embodiment, the diagram showing the formation of a second resin layer.

As shown in FIG. 12, the first resin layer 30 is formed around the opening on the one surface 14 side on which the metal pad 28 is formed. The first resin layer 30 may be formed by, for example, the film formation by spin coating and the pattern formation by etching. Then, as shown in FIG. 13, the wiring pattern 32 according to the specifications of the semiconductor device is formed on the resin layer. After the wiring pattern is formed, as shown in FIG. 14, the formation of a protective layer is performed by the second resin layer 34.

Incidentally, the semiconductor device 10 of the invention may be a plurality of semiconductor devices 10 which have the features described in the above embodiment and are laid one on top of another to be formed as a chip. Moreover, the semiconductor device 10 of the invention may have a rectangular or polygonal opening on the one surface side of the through hole 21. In addition, the shape of the electrode pad 24 may be similar to the shape of the opening on the other surface side of the through hole 21.

Figure 16:
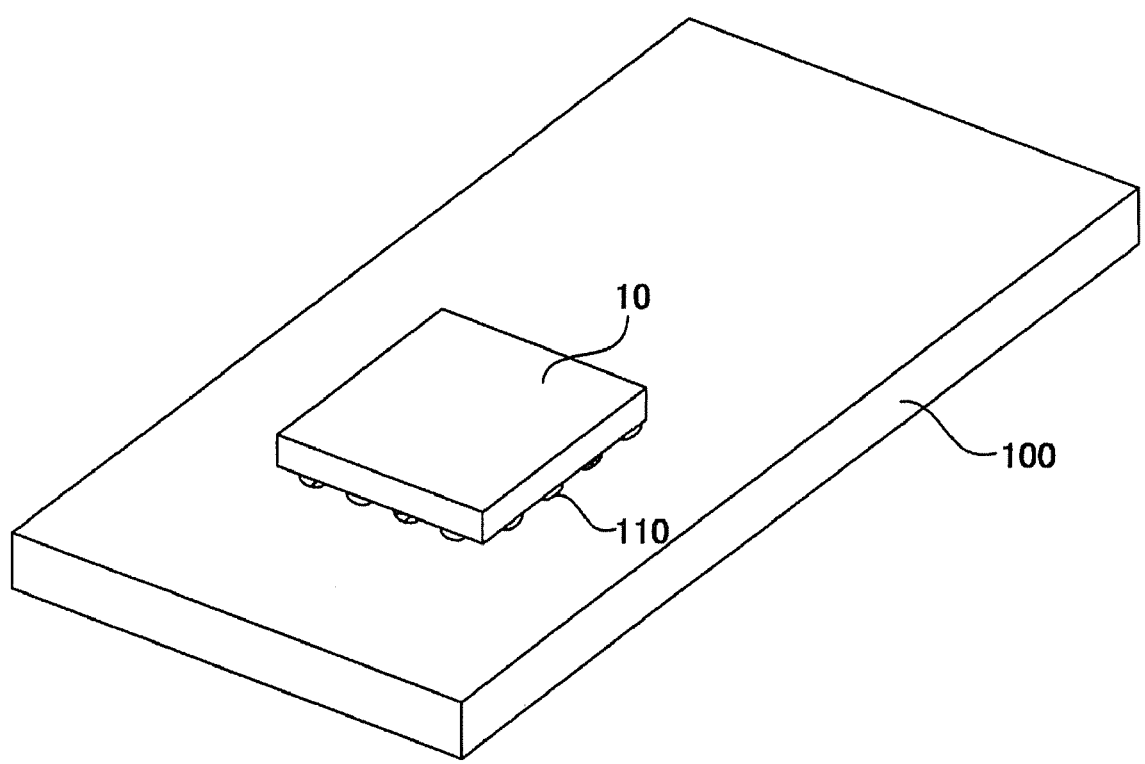
FIG. 16 is a diagram showing a circuit substrate on which the semiconductor device according to the embodiment is mounted.

FIG. 16 is a diagram showing a circuit substrate 100 on which the semiconductor device 10 of the invention is mounted. As the circuit substrate 100, for example, an organic substrate such as a glass epoxy substrate can be used. On the circuit substrate 100, a wiring pattern (not shown) made of conductive metal such as copper, aluminum, or gold is formed, and the wiring pattern and the semiconductor device 10 are electrically and physically connected via a bump 110 or the like.

Figure 17:
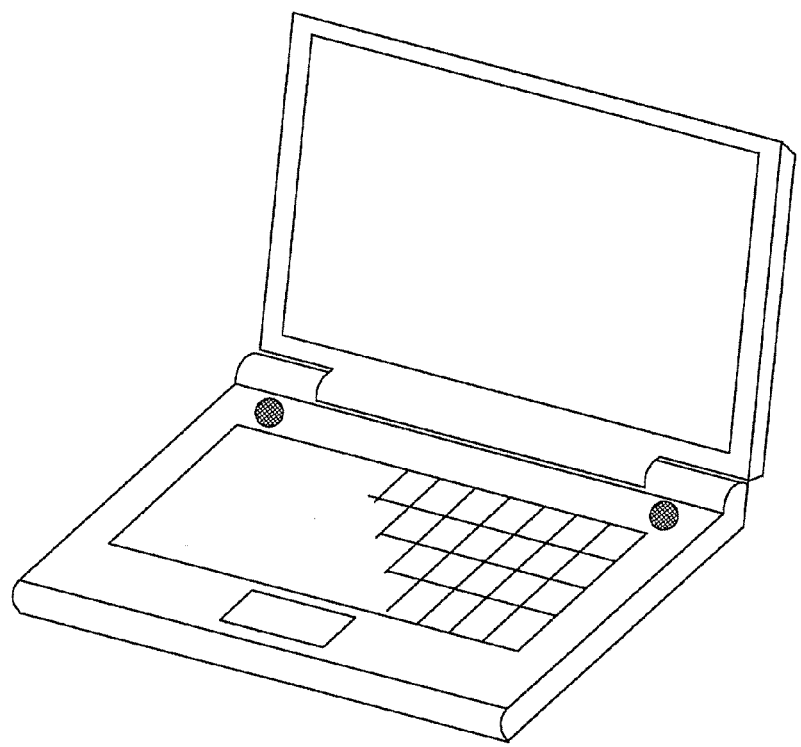
FIG. 17 is a diagram showing a personal computer as an example of an electronic device incorporating the semiconductor device according to the embodiment.
Figure 18:
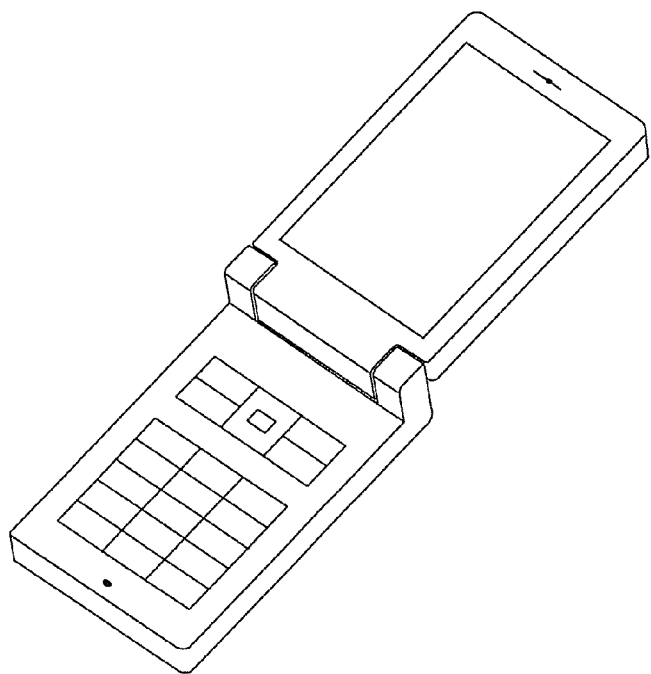
FIG. 18 is a diagram showing a cellular telephone as an example of an electronic device incorporating the semiconductor device according to the embodiment.

Examples of the electronic device of the invention include a personal computer shown in FIG. 17 and a cellular telephone shown in FIG. 18. In both of these examples, the semiconductor device 10 described in the above embodiment is incorporated thereinto as an internal device.

The entire disclosure of Japanese Patent Application No. 2009-238600, filed Oct. 15, 2009 is expressly incorporated by reference herein.

What is claimed is:

1. A semiconductor device, comprising:
    a silicon substrate that has a first surface and a second surface;
    a through hole that is formed in the silicon substrate, the through hole penetrating the silicon substrate from the first surface to the second surface;
    a rectangular electrode pad that is provided on the second surface with an insulation film provided between the electrode pad and the second surface;
    a first opening of the through hole provided at the first surface, the first opening having a circular shape; and
    a second opening of the through hole provided at the second surface, the second opening having a rectangular shape,
    wherein an area of the first opening is smaller than an area of the second opening, and
    the through hole has a truncated pyramid-shaped inclined surface next to the second opening, and the inclined surface is directed toward a center of the second opening.

2. The semiconductor device according to claim 1, wherein a through electrode that is formed in the through hole and penetrates the insulation film, and the through electrode is connected to the electrode pad.

3. The semiconductor device according to claim 1, wherein the area of the second opening is smaller than an area of the electrode pad.

4. The semiconductor device according to claim 1, wherein the first surface is a (100) face, and the inclined surface is a (111) face.

5. The semiconductor device according to claim 4, wherein a crystal face of the silicon substrate is determined such that edges of the silicon substrate and sides of the rectangular shaped second opening are parallel to each other.

6. A circuit substrate, comprising:
    the semiconductor device according to claim 1 mounted on the circuit substrate.

7. An electronic device, comprising:
    a circuit substrate; and
    the semiconductor device according to claim 1 mounted on the circuit substrate.

* * * * *